US009734975B2

(12) United States Patent
Kanapady et al.

(10) Patent No.: US 9,734,975 B2
(45) Date of Patent: Aug. 15, 2017

(54) IN-LINE FUSE ASSEMBLY

(71) Applicant: COOPER TECHNOLOGIES COMPANY, Houston, TX (US)

(72) Inventors: Ramdev Kanapady, Campbell, CA (US); Robert Stephen Douglass, Wildwood, MO (US)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 145 days.

(21) Appl. No.: 14/641,535

(22) Filed: Mar. 9, 2015

(65) Prior Publication Data

US 2016/0268091 A1 Sep. 15, 2016

(51) Int. Cl.
*H01H 85/20* (2006.01)
*H05K 7/00* (2006.01)

(52) U.S. Cl.
CPC ........ *H01H 85/201* (2013.01); *H01H 85/202* (2013.01)

(58) Field of Classification Search
CPC ............... H01H 85/003; H01H 85/055; H05K 2201/10181; H05K 2201/10583; H05K 7/202; H01R 33/95; H02B 1/04
See application file for complete search history.

(56) References Cited

U.S. PATENT DOCUMENTS 3,601,739 A * 8/1971 Blewitt ................ H01H 85/303 337/244
4,001,748 A * 1/1977 Salzer .................... H01H 69/02 337/159
4,540,969 A * 9/1985 Sugar ................ H01H 85/0458 337/228
5,003,281 A * 3/1991 Reese .................. H01H 85/157 337/232
2014/0266563 A1* 9/2014 Moody ................ H01H 85/042 337/162
2015/0348732 A1* 12/2015 Douglass ............. H01H 85/203 337/198

* cited by examiner

*Primary Examiner* — Robert J Hoffberg
*Assistant Examiner* — Hung Dang
(74) *Attorney, Agent, or Firm* — Armstrong Teasdale LLP

(57) ABSTRACT

An embodiment of an in-line fuse holder has been disclosed. The fuse holder includes a first terminal and a second terminal configured to cooperate with the first terminal in retaining a fuse between the first terminal and the second terminal, wherein each of the first and second terminals has a sidewall that defines a fuse-receiving socket, the sidewall having a plurality of apertures circumferentially spaced about the socket.

17 Claims, 5 Drawing Sheets

IN-LINE FUSE ASSEMBLY

BACKGROUND OF THE INVENTION

The field of the invention relates generally to electrical fuses and, more specifically, to an in-line fuse assembly.

Fuses are widely used as overcurrent protection devices to prevent costly damage to electrical circuits. Fuse terminals typically form an electrical connection between an electrical power source and an electrical component or a combination of components arranged in an electrical circuit. One or more fusible links or elements, or a fuse element assembly, is connected between the fuse terminals, so that when electrical current flowing through the fuse exceeds a predetermined limit, the fusible elements melt and open one or more circuits through the fuse to prevent electrical component damage.

Known in-line fuse assemblies have a holder that secures a fuse within an electrical circuit such as, for example, a solar photovoltaic power circuit. At least some in-line fuse holders have a pair of terminals that electrically connect the fuse to the circuit, and each terminal grips the fuse in a press fit engagement by imparting a compressive force on the fuse to secure the fuse within the terminal. However, excessive compression of the fuse can adversely affect the internal components of the fuse. For example, the solder of the internal fuse element can fracture or delaminate under the compressive load, thereby reducing the performance capability of the fuse. As such, it would be useful to provide an in-line fuse holder that imparts less compressive force when gripping a fuse.

BRIEF DESCRIPTION OF THE DRAWINGS

Non-limiting and non-exhaustive embodiments are described with reference to the following Figures, wherein like reference numerals refer to like parts throughout the various views unless otherwise specified.

DETAILED DESCRIPTION OF THE INVENTION

Exemplary embodiments of in-line fuse assemblies are described below. Method aspects will be in part apparent and in part explicitly discussed in the description.

Figure 1:
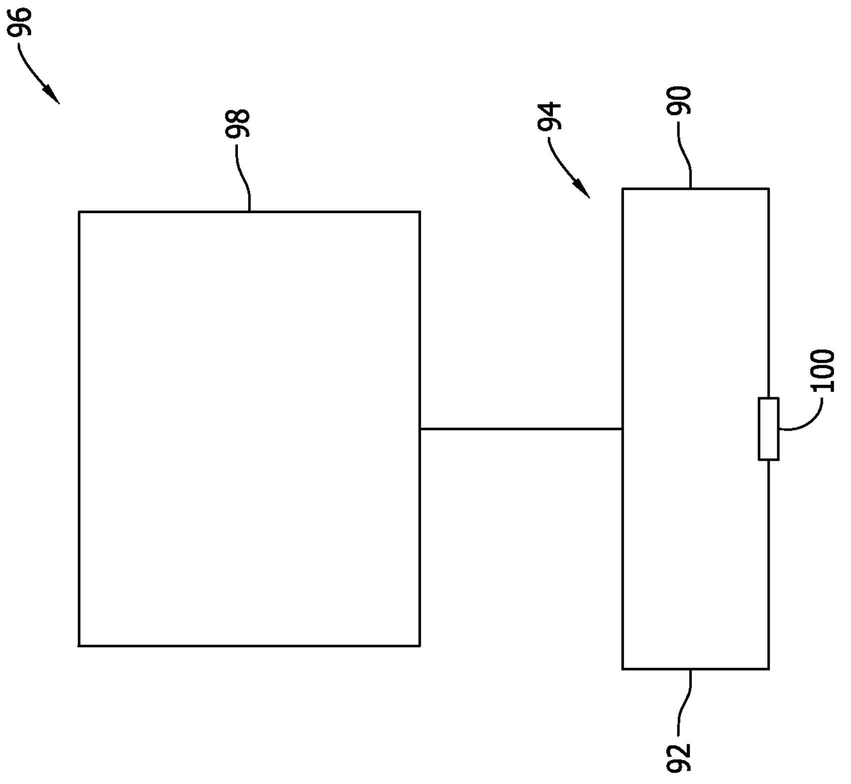
FIG. 1 is a schematic illustration of a solar photovoltaic power system.
Figure 2:
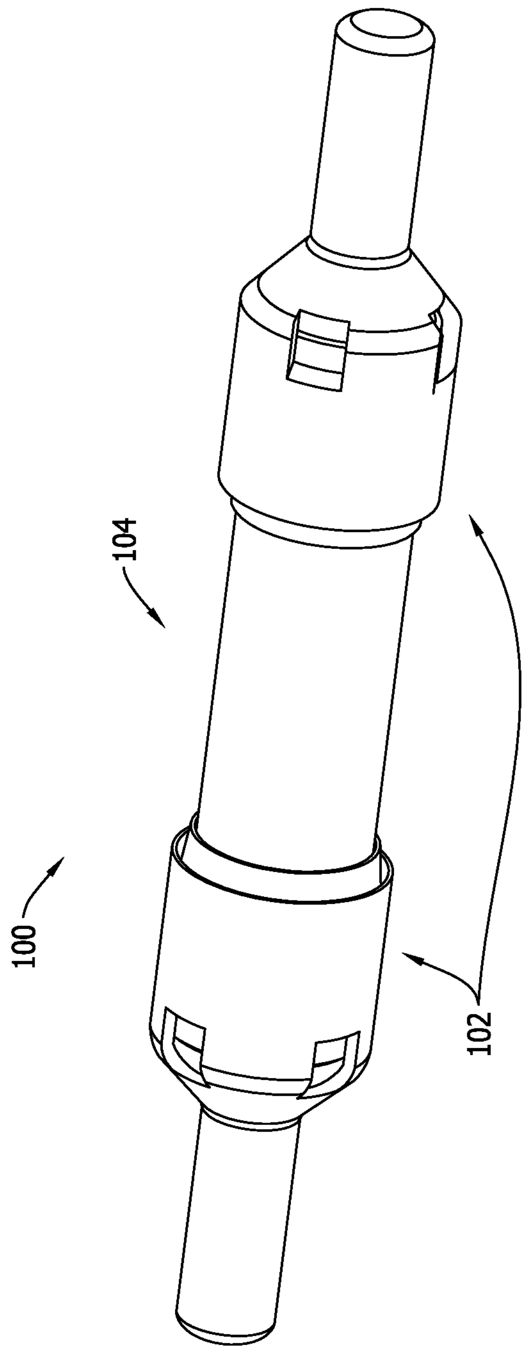
FIG. 2 is a perspective view of an in-line fuse holder assembly of the power system shown in FIG. 1.
Figure 3:
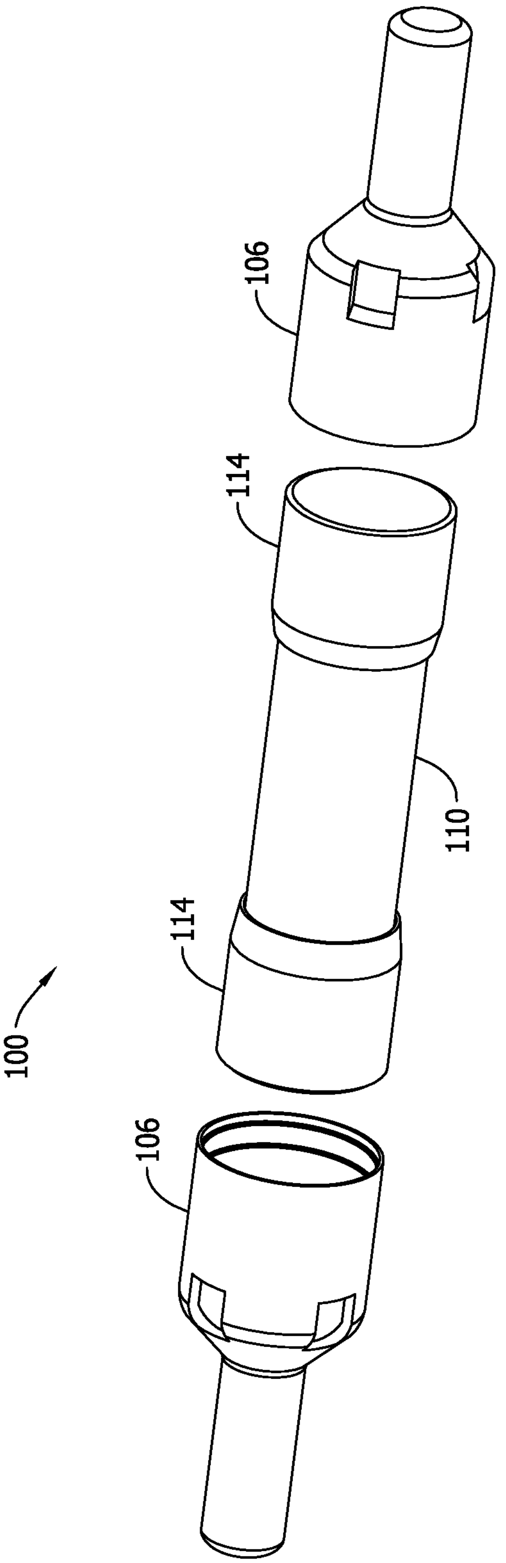
FIG. 3 is an exploded view of the fuse holder assembly shown in FIG. 2.

With reference to FIGS. 1-3, an in-line fuse assembly 100 is illustrated. The in-line fuse assembly 100 includes an in-line fuse holder 102 and a fuse 104 retained by the fuse holder 102. The fuse holder 102 has a pair of terminals 106 each having a longitudinal axis 108 (shown in FIG. 5) and being configured for electrically connecting the fuse 104 to wires 90, 92 in an electrical circuit 94 of, for example, a solar photovoltaic power system 96 having at least one solar panel 98. Suitably, in other embodiments, the in-line fuse holder 102 and associated fuse 104 may be configured for use in any suitable electrical circuit of any suitable system.

Figure 4:
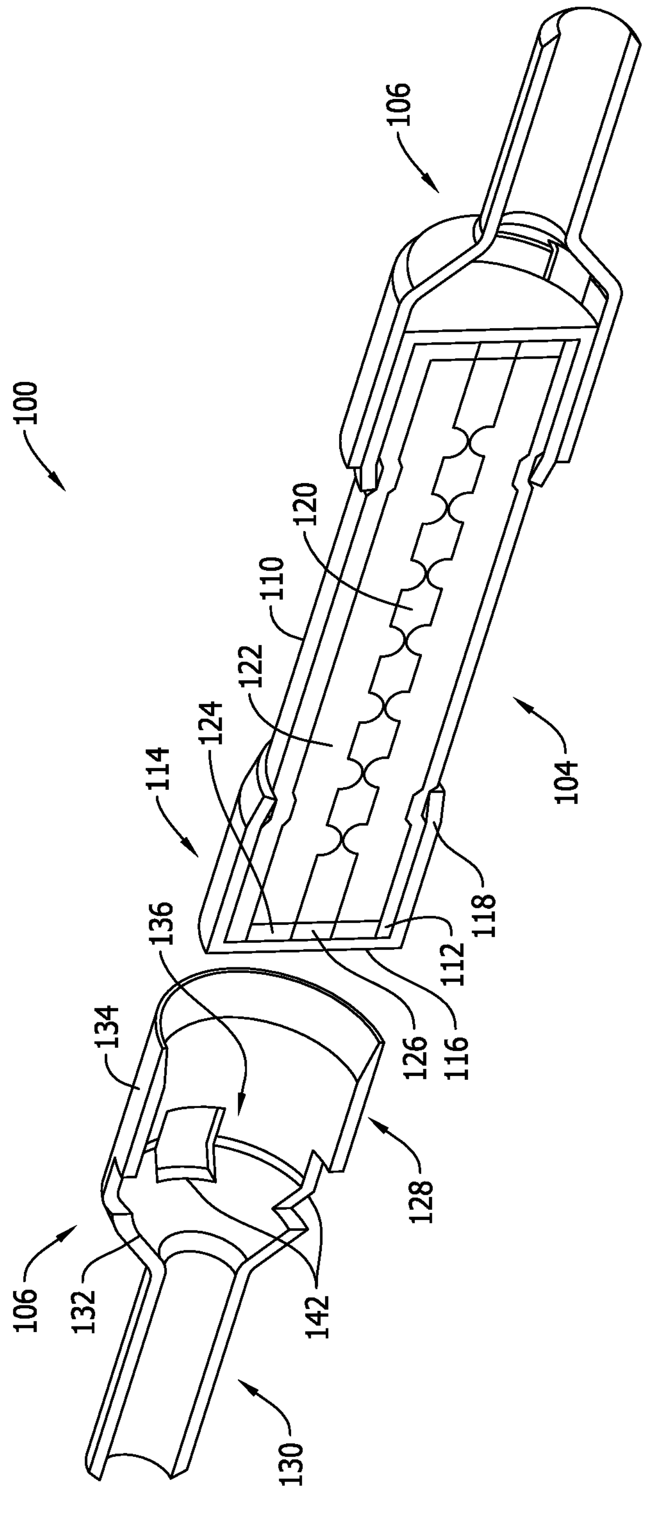
FIG. 4 is a cross-sectional view of the fuse holder assembly shown in FIG. 3.
Figure 5:
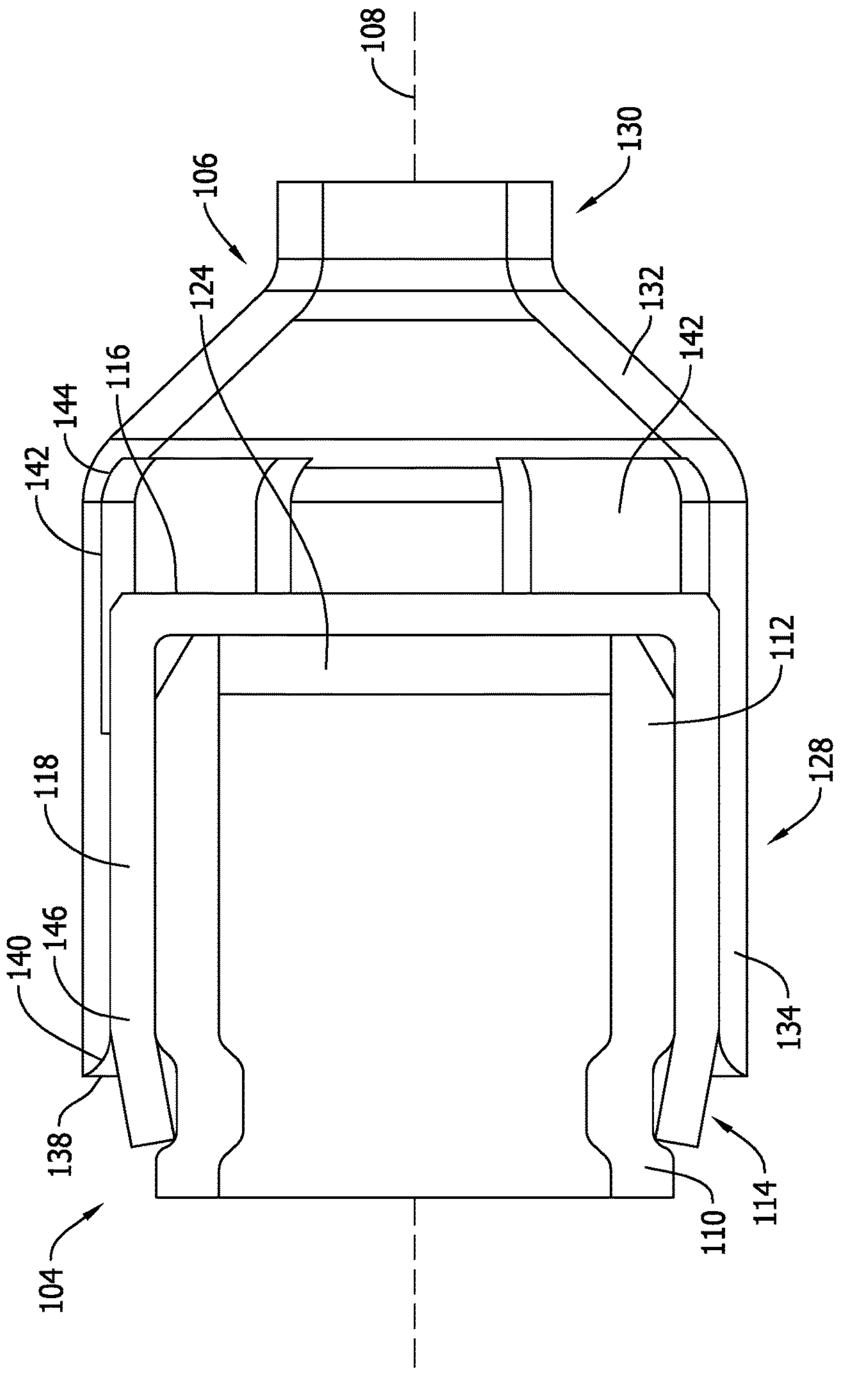
FIG. 5 is an enlarged portion of the cross-sectional view shown in FIG. 4.

Referring now to FIGS. 4 and 5, the fuse 104 has a nonconductive, tubular body 110, and the body 110 is covered at each of its open ends 112 by a conductive endcap 114. Each endcap 114 is generally cup-shaped, with a base 116 and a sidewall 118 that are integrally formed together such that the sidewall 118 extends from the base 116 to define an opening sized to receive one of the ends 112 of the body 110. Within the body 110 is disposed a fuse element 120 that extends the length of the body 110, and the fuse element 120 is surrounded by a filler 122 and is bonded at each of its ends 126 to the base 116 of a respective one of the endcaps 114 by solder 124 (e.g., lead-free solder) when the body 110 is inserted into the endcaps 114. Optionally, a metal washer may be provided to circumscribe the fuse element 120 at each of its ends 126, thereby facilitating a better electrical/solder connection between each end 126 of the fuse element 120 and the base 116 of its respective endcap 114.

In the illustrated embodiment, the body 110 is fabricated from a ceramic or melamine material, and the endcaps 114 are provided as ferrules fabricated from a bronze material. Moreover, the illustrated filler 122 is an inert, arc-absorbing (or arc-extinguishing) media such as a quartz silica sand material, and the illustrated fuse element 120 is a strip of metal (e.g., silver) having a plurality of weak spots spaced along its length. As such, in one example embodiment, the fuse 104 may be a 10×38 mm Photovoltaic Midget Fuse (Catalog No. PVM-XX, Datasheet No. 2153) having a 4-30 A current rating and a 600 VDC voltage rating, available from Bussmann by Eaton, St. Louis, Mo.

However, the fuse 104 may be any suitable fuse configured in any suitable manner that facilitates enabling the fuse holder 102 to function as described herein (e.g., the fuse 104 may have any suitable size, current rating, and voltage rating). For example, each ferrule-type endcap 114 may be made up of a first generally cup-shaped member that receives a second generally cup-shaped member therein (e.g., the second member may have a hole in its base 116 that permits adding the filler 122 into the body 110 after the second member has already been coupled to the body 110, and the first member may then be used to cover the hole of the second member after the filler 122 has been added to the body 110 through the hole). In another example, the body 110 may not be tubular, and the endcaps 114 may not be provided as ferrules. Moreover, the body 110, the endcaps 114, and the filler 122 may be fabricated from any suitable material, and the fuse 104 may have any suitable number of fuse elements 120 each configured in any suitable manner and fabricated from any suitable material.

In terms of the fuse holder 102 in particular, each of the illustrated terminals 106 is configured as an in-line, wire-crimp-type terminal fabricated from a conductive material (e.g., a brass material). Each terminal 106 is generally tubular, with a fuse-receiving end 128 and a wire-receiving end 130 that is narrower than the fuse-receiving end 128. The wire-receiving end 130 is configured for crimping onto a wire 90, 92 (or bundle of wires) using a suitable crimping tool (e.g., Sta-Kon® Comfort Crimp® Compression Tool, Model ERG4002 by Thomas & Betts). The wires 90, 92 may be 10-12AWG stranded solar photovoltaic (PV) wire in one embodiment, or may alternatively be other types of wire in other embodiments.

The fuse-receiving end 128 is generally cup-shaped and has a base 132 and an annular sidewall 134 extending axially from the base 132 to define a socket 136 sized to receive one of the endcaps 114 of the fuse 104. When the fuse 104 is not inserted into the terminal 106, it is apparent that the sidewall 134 tapers inward somewhat in its axial extension from the base 132. Moreover, the sidewall 134 has a leading edge 138 that is obliquely angled or rounded on its inner surface 140. As used herein, the terms "inner," "inward," "outer," "outward," and any variations thereof are directional modifiers indicating a disposition relative to the longitudinal axis 108 of a respective one of the terminals 106 (e.g., inward movement is movement generally perpendicular to, and toward, the longitudinal axis 108, and outward movement is movement generally perpendicular to, and away from, the longitudinal axis 108).

With the fuse holder 102 configured in such a manner, the terminals 106 are to be coupled to the fuse 104 by forcibly inserting each endcap 114 of the fuse 104 into a respective one of the sockets 136 of the terminals 106. To initiate insertion, each endcap 114 of the fuse 104 contacts the inner surface 140 of the leading edge 138 of the sidewall 134 of one of the respective terminals 106, thereby driving the sidewall 134 outward in a cam-like manner to provide clearance for complete insertion of the endcap 114 into the socket 136 until the base 116 of the endcap 114 nearly contacts the base 132 of the fuse-receiving end 128 of the terminal 106. After the fuse 104 has been completely inserted into the sockets 136 of the terminals 106, the fuse-receiving end 128 of each terminal 106 secures the fuse 104 therein by press fit (e.g., interference fit, or friction fit) engagement with the respective endcap 114 by virtue of the endcaps 114 having driven the sidewalls 134 of the terminals 106 outward during insertion of the fuse 104 into the terminals 106. Notably, in terms of each terminal 106, such a press fit engagement with the respective endcap 114 causes the terminal 106 to impart compressive forces against the sidewall 118 of the endcap 114 to facilitate retaining the fuse 104 between the terminals 106 (i.e., the press fit engagement makes it difficult to pull the terminals 106 off of the endcaps 114 of the fuse 104).

While the compressive force imparted by the terminals 106 on the endcaps 114 may work to secure the fuse 104 between the terminals 106, the compressive force may adversely affect the fuse 104. More specifically, some embodiments of the fuse 104 may have components that are more susceptible to being damaged in the face of compressive loads. For example, as mentioned above in one embodiment of the fuse 104, the solder 124 that electrically couples the fuse element 120 to the base 116 of each endcap 114 may be fabricated from a lead-free material (e.g., a lead-free wave solder alloy such as ALPHA® Vaculoy SACX0307). In that regard, the lead-free nature of the solder 124 may render the solder 124 more susceptible to fracturing or delaminating from the base 116 of the respective endcap 114 in response to the compressive force imparted on the endcap 114 by its respective terminal 106 (i.e., the compressive force imparted on the endcaps 114 can undesirably be transferred at least in part to the solder 124 via the sidewall 118, the body 110, and the filler 122, such that the solder 124 bears a significant compressive load). However, if the solder 124 was to fracture or delaminate from the base 116 of its respective endcap 114 in the face of such compressive loading, the electrical connection between the endcap 114 and the fuse element 120 could be compromised, which could in turn cause the fuse 104 to function improperly. As such, it would be desirable to lessen the compressive force of the terminals 106 on the endcaps 114 (at least along the axial region of the fuse 104 that is occupied by the solder 124), while also maintaining a secure connection between the fuse 104 and the terminals 106.

With this goal in mind, each of the illustrated terminals 106 is provided with a plurality of apertures 142 (or reliefs) near the junction 144 of the sidewall 134 and the base 132 of the fuse-receiving end 128. The apertures 142 are circumferentially spaced part from one another about the socket 136, and each aperture 142 extends in a generally axial direction from the base 132 (e.g., from the junction 144) along the sidewall 134. More specifically, the apertures 142 are each sized to extend axially beyond the solder 124 when the fuse 104 is fully inserted into the terminal 106. As such, because the presence of the apertures 142 in the sidewall 134 results in less surface area of the terminal 106 in contact with the endcap 114 near the base 116 of the endcap 114, the terminal 106 is configured to impart less of a compressive force on the endcap 114 near the base 116 than it does near the distal end 146 of the sidewall 118. The result is that the solder 124 is somewhat isolated from the bulk of the compressive force imparted on the endcap 114 by the terminal 106, thereby ensuring that the compressive stress on the solder 124 does not exceed the tensile strength of the solder 124. This lessens the opportunity for the solder 124 to fracture or delaminate under the compressive load applied by the terminal 106.

Generally speaking, as the number and/or size of apertures 142 increases, the electrical resistance of the terminal 106 may also increase because there is less conductive material near the base 132 of the terminal 106. Thus, the number and size of the apertures 142 (i.e., the amount of open space about the circumference of the terminal 106 near the base 132 of the terminal 106) should be selected to balance the competing interests of: (1) decreasing the compressive force imparted to the endcap 114 at the base 116 of the endcap 114; and (2) decreasing the resistance that results from less conductive material being provided on the terminal 106 near the base 132 of the terminal 106.

That said, in some embodiments, the size and the number of the apertures 142 should be selected to ensure that the compressive load on the solder 124 is at most 50% of the tensile strength of the solder 124. For example, in one embodiment if the tensile strength of the solder 124 is 24 MPa, then the number and the size of the apertures 142 should be selected to ensure that the overall compressive load on the solder 124 is at most 12 MPa. In such an example, a pull force requirement of about 881 lbf would be established to remove the terminal 106 from its respective endcap 114 assuming about a 0.3 coefficient of friction between the terminal 106 and the endcap 114.

In the illustrated embodiment, each terminal 106 has been provided with four apertures 142, and each aperture 142 is about 3.5 mm×4 mm. In other embodiments, however, each of the terminals 106 may have any suitable number of apertures 142 sized in any suitable manner that facilitates enabling the terminals 106 to function as described herein. As used herein, the term "circumference" or any variation thereof refers to a parameter defined about the perimeter of an object having any suitable cross-sectional shape (e.g., a square shape, a rectangle shape, a triangle shape, etc.) and is not limited to a parameter defined about the perimeter of an object having a circular cross-sectional shape.

The benefits of the inventive concepts described are now believed to have been amply illustrated in relation to the exemplary embodiments disclosed.

An embodiment of an in-line fuse holder has been disclosed. The fuse holder includes a first terminal and a second terminal configured to cooperate with the first terminal in retaining a fuse between the first terminal and the second terminal, wherein each of the first and second terminals has a sidewall that defines a fuse-receiving socket, the sidewall having a plurality of apertures circumferentially spaced about the socket.

Optionally, the sidewall may have four apertures. The terminal may also be fabricated from a conductive material. The conductive material of the terminal may be a brass material. Furthermore, the terminal may be configured as a wire-crimp terminal. The terminal may also have a fuse-receiving end and a wire-receiving end that is narrower than the fuse-receiving end, the fuse-receiving end defining the socket. The fuse-receiving end and the wire-receiving end may be integrally formed together. Additionally, the terminal may have a base, and the sidewall may have a leading edge and extend from the base to the leading edge to define the socket such that the sidewall tapers from the base toward the leading edge. The sidewall may have an oblique or rounded inner surface at the leading edge. Moreover, the terminal may have a base, and the sidewall may have a leading edge and extend from the base to the leading edge to define the socket, each aperture extending along the sidewall toward the leading edge from near the base.

An embodiment of an in-line fuse assembly has also been disclosed. The in-line fuse assembly includes a fuse and a fuse holder having a pair of terminals each with a sidewall that defines a fuse-receiving socket, wherein the sidewall has a plurality of apertures circumferentially spaced about the socket.

Optionally, the fuse may have a body with opposing ends, and a conductive endcap coupled to each end of the body, and each socket of the fuse holder may be sized to receive one of the endcaps. The body of the fuse may be nonconductive. The body may be fabricated from a ceramic material. The body may also be fabricated from a melamine material. Furthermore, the fuse may have a fuse element disposed within the body. The fuse element may be fabricated from a strip of metal having a plurality of weak spots spaced therealong. The fuse element may be surrounded by a filler of quartz silica sand material. The fuse element may also be bonded to each of the endcaps by solder. The solder may be a lead-free solder. Moreover, the terminal may have a base, and the sidewall may extend from the base along a longitudinal axis of the terminal to define the socket, each aperture extending axially beyond the solder along the sidewall from near the base. Additionally, the terminal may be configured such that the compressive load imparted on the solder by the sidewall is at most 50% of the tensile strength of the solder. Also, the sidewall may have four apertures.

An embodiment of a solar photovoltaic power system is also disclosed. The solar photovoltaic power system includes: a solar panel; a circuit electrically connected to the solar panel, wherein the circuit has a plurality of wires; and an in-line fuse assembly electrically connecting a first one of the wires to a second one of the wires. The in-line fuse assembly includes a fuse holder and a fuse having a body with a first end and second end. The fuse holder includes: a first terminal configured for receiving the first end of the body and electrically connecting the fuse to the first wire; and a second terminal configured for receiving the second end of the body and electrically connecting the fuse to the second wire. Each of the first and second terminals comprises a sidewall that defines a fuse-receiving socket in which the respective one of the first end and the second end of the body is to be received, the sidewall having a plurality of apertures circumferentially spaced about the socket.

Optionally, each of the first and second terminals may be configured for crimping onto the respective one of the first and second wires. Each of the terminals may also have a fuse-receiving end defining the socket, and a wire-receiving end configured for receiving the respective one of the first and second wires, the wire-receiving end being narrower than the fuse-receiving end. The terminals may further be fabricated from a conductive material. The conductive material may be a brass material. Additionally, the fuse may have a pair of endcaps each coupled to one of the ends of the body, and a fuse element disposed within the body such that the fuse element is soldered to the endcaps. The fuse element may be soldered to the endcaps using a lead-free solder. The fuse element may be fabricated from a strip of silver having a length and a plurality of weak spots spaced along the length. The fuse element may be surrounded by an inert, arc-absorbing quartz silica sand material. Moreover, the body may be fabricated from a ceramic material or a melamine material. The endcaps may also be fabricated from a bronze material. The fuse may have a 4-30 A current rating and a 600 VDC voltage rating.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An in-line fuse holder comprising:

a first terminal; and a second terminal configured to cooperate with the first terminal in retaining a fuse between the first terminal and the second terminal, wherein each of the first and second terminals comprises a tubular wire receiving end having a first inner diameter and a fuse receiving end including a conical base and an annular sidewall that defines a fuse-receiving socket having a second inner diameter greater than the first diameter; and a plurality of apertures extending through at least a portion of the annular sidewall and a portion of the conical base, the plurality of apertures being circumferentially spaced apart from one another near a junction of the annular sidewall and the conical base.

2. The in-line fuse holder of claim 1, wherein the plurality of apertures includes at least four apertures.

3. The in-line fuse holder of claim 1, wherein the annular sidewall includes a leading edge, and annular sidewall being inwardly tapered from the junction toward the leading edge.

4. The in-line fuse holder of claim 3, wherein the leading edge is obliquely angled or rounded with respect to the annular sidewall.

5. An in-line fuse assembly comprising:

a fuse including a body with opposing ends, a fuse element within the body and a conductive endcap coupled to each end of the body; and a fuse holder having a pair of terminals each having a conical base and an annular sidewall that defines a fuse-receiving socket sized to receive one of the endcaps of the fuse, wherein a plurality of apertures extend through a portion of the annular sidewall and a portion of the conical base section, the plurality of apertures further extending in circumferentially spaced locations from one another.

6. The in-line fuse assembly of claim 5, wherein the body is fabricated from a ceramic material.

7. The in-line fuse assembly of claim 5, wherein the body is fabricated from a melamine material.

8. The in-line fuse assembly of claim 5, wherein the fuse element is fabricated from a strip of metal having a plurality of weak spots spaced therealong.

9. The in-line fuse assembly of claim 8, wherein the fuse element is surrounded by a filler of quartz silica sand material.

10. The in-line fuse assembly of claim 5, wherein the fuse element is soldered to the endcaps.

11. The in-line fuse assembly of claim 10, wherein the solder is a lead-free solder.

12. The in-line fuse assembly of claim 10, wherein each aperture extends axially beyond the solder.

13. The in-line fuse assembly of claim 10 wherein at least one of the pair of terminals is configured such that the overall compressive load imparted on the solder by the sidewall is at most 50% of the tensile strength of the solder.

14. The in-line fuse assembly of claim 5 wherein the fuse has a 4-30 A current rating and a 600 VDC voltage rating.

15. A solar photovoltaic power system comprising:

a solar panel;

a circuit electrically connected to the solar panel, wherein the circuit has a plurality of wires; and an in-line fuse assembly electrically connecting a first one of the wires to a second one of the wires, wherein the in-line fuse assembly includes a fuse holder and a fuse having a body with a first end and second end, the in-line fuse assembly comprising:

a first terminal configured for receiving the first end of the fuse and electrically connecting the fuse to the first wire; and a second terminal configured for receiving the second end of the fuse and electrically connecting the fuse to the second wire, wherein each of the first and second terminals comprises a conical base and an annular sidewall that defines a fuse-receiving socket in which the respective one of the first end and the second end of the fuse is to be received, wherein a plurality of apertures extend through the a portion of the annular sidewall and a portion of the conical base and wherein the plurality of apertures are circumferentially spaced about the fuse-receiving socket.

16. The solar photovoltaic power system of claim 15, wherein each of the first and second terminals is configured for crimping onto the respective one of the first and second wires.

17. The solar photovoltaic power system of claim 15, in combination with a fuse:

wherein the fuse includes conductive end caps soldered to a fuse element;

wherein each of the first and second terminals is configured such that the overall compressive load imparted on the solder by the sidewall is at most 50% of the tensile strength of the solder; and wherein the fuse has a 4-30 A current rating and a 600 VDC voltage rating.

* * * * *